US012730478B2

(12) United States Patent
Mandlik et al.

(10) Patent No.: US 12,730,478 B2
(45) Date of Patent: Sep. 8, 2026

(54) STRETCHABLE DISPLAY

(71) Applicant: Apple Inc., Cupertino, CA (US)

(72) Inventors: Prashant Mandlik, Sunnyvale, CA (US); Bhadrinarayana Lalgudi Visweswaran, San Mateo, CA (US); Mahendra Chhabra, Los Gatos, CA (US); Chia-Hao Chang, Taoyuan (TW); Shiyi Liu, San Jose, CA (US); Siddharth Harikrishna Mohan, Aurora, IL (US); Zhen Zhang, Sunnyvale, CA (US); Han-Chieh Chang, Sunnyvale, CA (US); Yi Qiao, San Jose, CA (US); Yue Cui, Campbell, CA (US); Tyler R Kakuda, San Francisco, CA (US); Michael Vosgueritchian, San Francisco, CA (US); Sudirukkuge T Jinasundera, San Jose, CA (US); Warren S Rieutort-Louis, Cupertino, CA (US); Tsung-Ting Tsai, San Jose, CA (US); Jae Won Choi, San Jose, CA (US); Jiun-Jye Chang, Cupertino, CA (US); Jean-Pierre S Guillou, San Diego, CA (US); Rui Liu, San Jose, CA (US); Po-Chun Yeh, Sunnyvale, CA (US); Chieh Hung Yang, Taipei (TW); Ankit Mahajan, Los Gatos, CA (US); Takahide Ishii, Taoyuan (TW); Pei-Ling Lin, New Taipei City (TW); Pei Yin, Taoyuan (TW); Gwanwoo Park, Seoul (KR); Markus Einzinger, Sunnyvale, CA (US); Martijn Kuik, Santa Clara, CA (US); Abhijeet S Bagal, Sunnyvale, CA (US); Kyounghwan Kim, San Jose, CA (US); Jonathan H Beck, San Francisco, CA (US); Chiang-Jen Hsiao, New Taipei City (TW); Chih-Hao Kung, Hsinchu (TW); Chih-Lei Chen, Tai Chung (TW); Chih-Yu Chung, Zhongli (TW); Chuan-Jung Lin, Yunlin (TW); Jung Yen Huang, Taoyuan (TW); Kuan-Chi Chen, Hsinchu (TW); Shinya Ono, Santa Clara, CA (US); Wei Jung Hsieh, Taoyuan (TW); Wei-Chieh Lin, Hsinchu (TW); Yi-Pu Chen, New Taipei City (TW); Yuan Ming Chiang, Zhubei (TW); An-Di Sheu, Taipei (TW); Chi-Wei Chou, New Taipei City (TW); Chin-Fu Lee, Yuanlin (TW); Ko-Wei Chen, New Taipei City (TW); Kuan-Yi Lee, New Taipei City (TW); Weixin Li, Sunnyvale, CA (US); Shin-Hung Yeh, Taipei (TW); Shyuan Yang, San Jose, CA (US); Themistoklis Afentakis, San Jose, CA (US); Asli Sirman, San Jose, CA (US); Baolin Tian, San Jose, CA (US); Han Liu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 447 days.

(21) Appl. No.: 18/483,653

(22) Filed: Oct. 10, 2023

(65) Prior Publication Data

US 2024/0210995 A1 Jun. 27, 2024

Related U.S. Application Data

(60) Provisional application No. 63/476,496, filed on Dec. 21, 2022.

(51) Int. Cl.
*G06F 1/16* (2006.01)
*H10K 59/131* (2023.01)
(Continued)

(52) U.S. Cl.
CPC ......... *G06F 1/1652* (2013.01); *H10K 59/131* (2023.02); *H10K 59/40* (2023.02); *H10K 77/111* (2023.02); *H10K 2102/311* (2023.02)

(58) Field of Classification Search
None
See application file for complete search history.

(56) References Cited

U.S. PATENT DOCUMENTS 7,864,136 B2 1/2011 Matthies et al.
8,217,571 B2 7/2012 Lee et al.
(Continued)

FOREIGN PATENT DOCUMENTS

CN 108074951 A 5/2018
CN 109360900 A 2/2019
(Continued)

*Primary Examiner* — Bilkis Jahan

(74) *Attorney, Agent, or Firm* — Treyz Law Group, P.C.; Joseph F. Guihan; Jinie M. Guihan

(57) ABSTRACT

A display may have a stretchable portion with hermetically sealed rigid pixel islands. A flexible interconnect region may be interposed between the hermetically sealed rigid pixel islands. The hermetically sealed rigid pixel islands may
(Continued)

include organic light-emitting diode (OLED) pixels. A conductive cutting structure may have an undercut that causes a discontinuity in a conductive OLED layer to mitigate lateral leakage. The conductive cutting structure may also be electrically connected to a cathode for the OLED pixels and provide a cathode voltage to the cathode. First and second inorganic passivation layers may be formed over the OLED pixels. Multiple discrete portions of an organic inkjet printed layer may be interposed between the first and second inorganic passivation layers.

22 Claims, 12 Drawing Sheets

(51) Int. Cl.

| | |
|---|---|
| ***H10K 59/40*** | (2023.01) |
| ***H10K 77/10*** | (2023.01) |
| *H10K 102/00* | (2023.01) |

(56) References Cited

U.S. PATENT DOCUMENTS

| | | | | |
|---|---|---|---|---|
| 10,199,448 | B2 | 2/2019 | Kim et al. | |
| 10,304,906 | B2 | 5/2019 | Hack et al. | |
| 10,468,637 | B2 | 11/2019 | Defranco et al. | |
| 10,879,327 | B2 * | 12/2020 | Tanaka | H10K 59/122 |
| 11,145,700 | B2 | 10/2021 | Choi et al. | |
| 11,309,372 | B2 | 4/2022 | Choi et al. | |
| 2012/0007067 | A1 | 1/2012 | Kaneta et al. | |
| 2012/0091482 | A1 * | 4/2012 | Uchida | H10K 59/122<br>438/22 |
| 2014/0103385 | A1 | 4/2014 | Hatano et al. | |
| 2014/0183501 | A1 | 7/2014 | Kim et al. | |
| 2015/0048328 | A1 | 2/2015 | Kato et al. | |
| 2016/0266295 | A1 | 9/2016 | Cho et al. | |
| 2016/0268354 | A1 | 9/2016 | Xiong et al. | |
| 2017/0309693 | A1 * | 10/2017 | Pang | H10K 59/122 |
| 2018/0212191 | A1 | 7/2018 | Jin | |
| 2019/0058022 | A1 | 2/2019 | Baik et al. | |
| 2019/0088906 | A1 * | 3/2019 | Park | H10K 59/30 |
| 2019/0123112 | A1 * | 4/2019 | Lee | H10K 59/40 |
| 2019/0326372 | A1 | 10/2019 | Han et al. | |
| 2020/0066815 | A1 | 2/2020 | Choi et al. | |

FOREIGN PATENT DOCUMENTS

| | | | |
|---|---|---|---|
| CN | 112133198 | B | 4/2022 |
| EP | 3767682 | A1 | 1/2021 |
| JP | 2008091071 | A | 4/2008 |
| JP | 2013033728 | A | 2/2013 |
| JP | 2014044938 | A | 3/2014 |
| JP | 2014082132 | A | 5/2014 |
| KR | 1020130007971 | A | 1/2013 |
| KR | 1020140140484 | A | 12/2014 |
| KR | 20210095087 | A | 7/2021 |
| WO | 2018212960 | A1 | 11/2018 |
| WO | 2020192083 | A1 | 10/2020 |

* cited by examiner 14
42
48
58
52
54
56
76
78
80
82
22-2
88-2
74
70
68-3
60
86
62-2
66
64-2
68-2
64-1
22-1
88-1
72
62-1
68-1
84

72
70
212
214
64
74
72
70
212
66
64
68
48

STRETCHABLE DISPLAY

This application claims the benefit of U.S. provisional patent application No. 63/476,496, filed Dec. 21, 2022, which is incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode. Conventional displays may be rigid.

SUMMARY

A display may include a first organic light-emitting diode pixel comprising a first electrode, a second organic light-emitting diode pixel comprising a second electrode, a common electrode for the first and second organic light-emitting diode pixels, a conductive layer that has a first portion that forms part of the first organic light-emitting diode pixel and a second portion that forms part of the second organic light-emitting diode pixel, and a conductive structure that is interposed between the first and second electrodes. The conductive structure may have an undercut that causes a discontinuity in the conductive layer and the conductive structure may be electrically connected to the common electrode.

A display may include plurality of pixels, wherein each pixel has a respective anode, a common cathode for the plurality of pixels, organic light-emitting diode layers for the plurality of pixels that are interposed between the anodes and the common cathode, a first inorganic passivation layer that is formed over the common cathode, a second inorganic passivation layer that is formed over the first inorganic passivation layer, and an organic layer with multiple discrete portions between the first and second inorganic passivation layers. No portions of the organic layer are included between the first and second inorganic passivation layers in some portions of the first and second inorganic passivation layers.

A display may include a plurality of hermetically sealed rigid pixel islands and a flexible interconnect region that is interposed between the plurality of hermetically sealed rigid pixel islands. Each hermetically sealed rigid pixel island may include at least one organic light-emitting diode pixel with organic light-emitting diode layers interposed between first and second electrodes and a conductive cutting structure that causes a discontinuity in one of the organic light-emitting diode layers and that is electrically connected to the second electrode.

DETAILED DESCRIPTION

Figure 1:
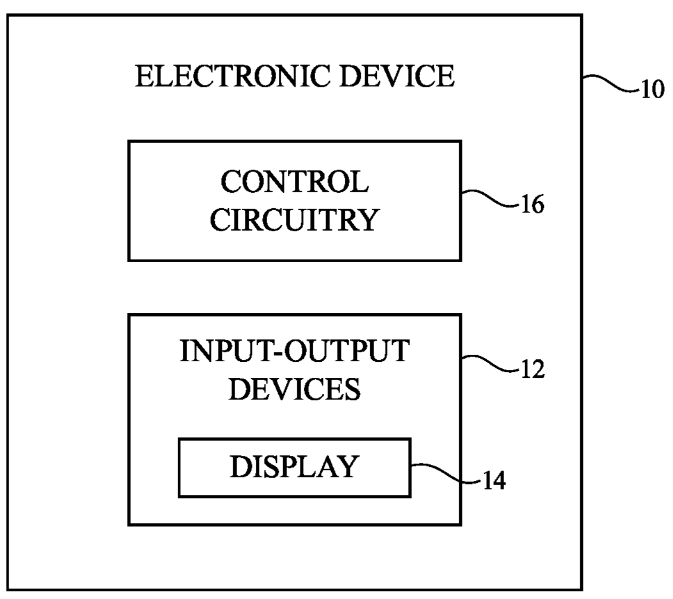
FIG. 1 is a schematic diagram of an illustrative electronic device having a display in accordance with some embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a liquid crystal display, an organic light-emitting diode display, or any other desired type of display. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
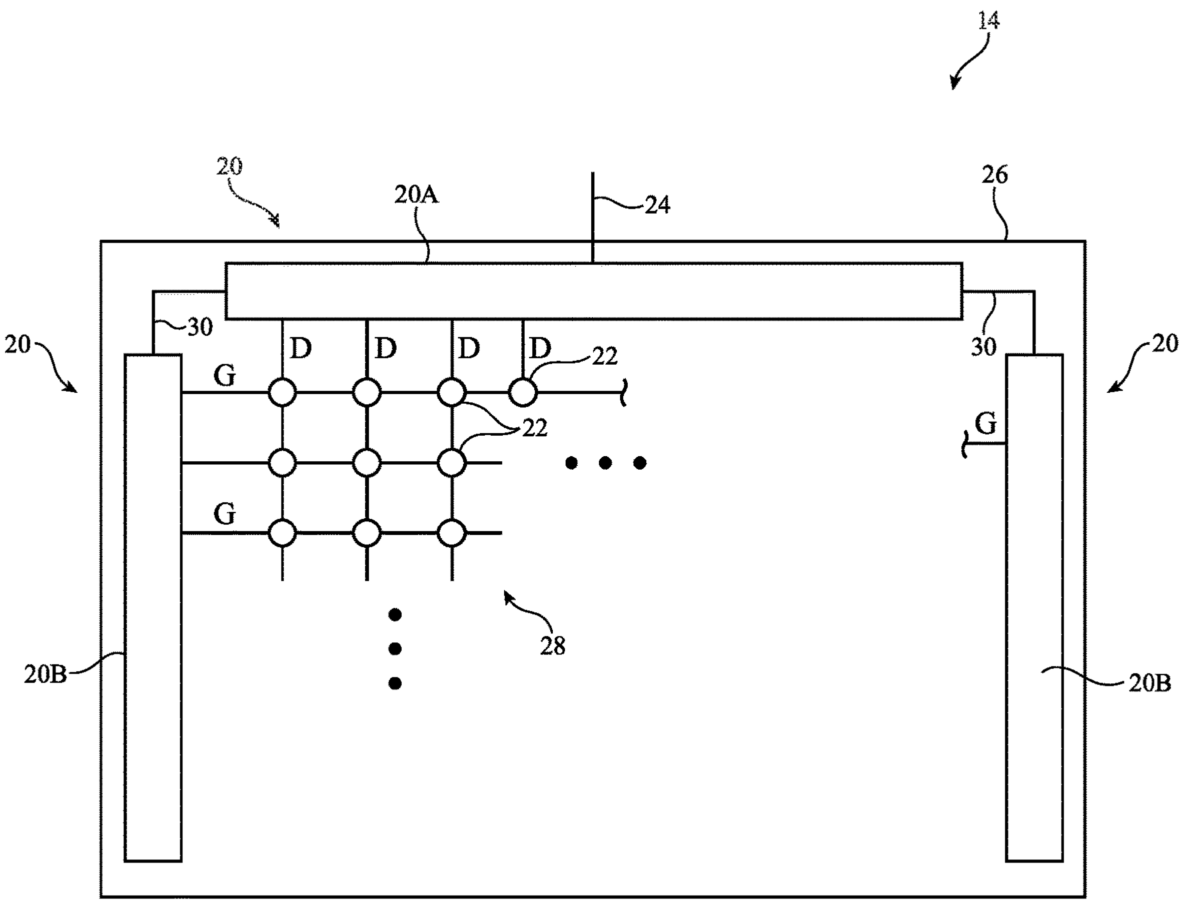
FIG. 2 is a schematic diagram of an illustrative display in accordance with some embodiments.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

For some electronic devices, it may be desirable for display 14 to be stretchable. The stretchable display may allow for the display to have portions with compound curvature (curvature along multiple axes), for example. To allow for the display to be highly stretchable, the display may have rigid pixel islands connected by a highly stretchable interconnect region.

Figure 3:
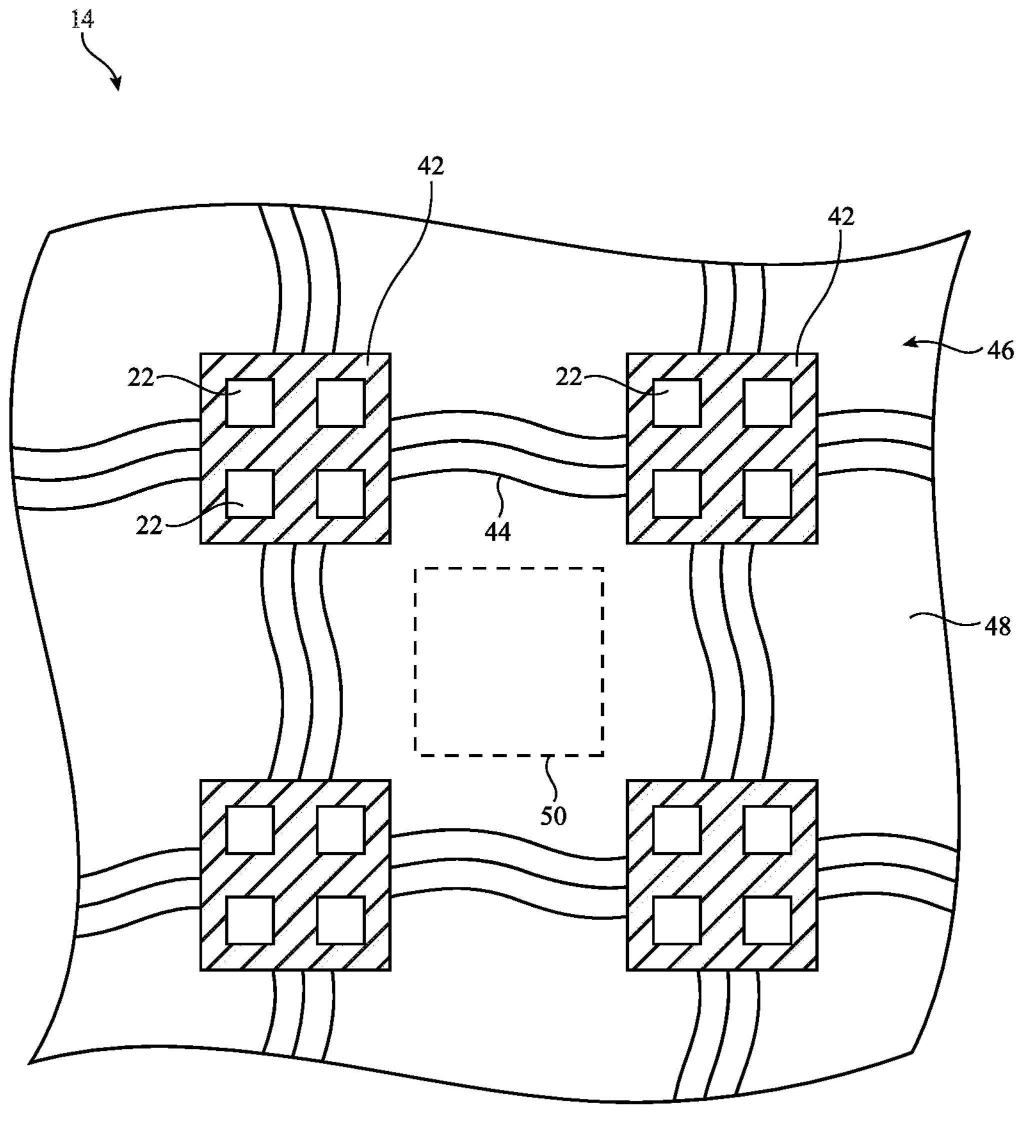
FIG. 3 is a top view of an illustrative display with rigid pixel islands on a flexible substrate in accordance with some embodiments.

FIG. 3 is a top view of an illustrative stretchable display with rigid pixel islands and a highly stretchable interconnect region. As shown in FIG. 3, the display 14 may include rigid pixel islands 42 (sometimes referred to as rigid pixel portions 42, rigid portions 42, etc.). Each rigid pixel island 42 includes one or more pixels 22. The rigid pixel island may be relatively rigid (e.g., a tensile strain threshold of less than 1%). However, the rigid pixel islands are connected by a flexible interconnect region 46.

The flexible interconnect region 46 may be formed by, for example, a flexible substrate 48 (sometimes referred to as polymer layer 48, highly stretchable polymer material 48, substrate 48, stretchable substrate 48, flexible substrate 48, etc.). The flexible substrate 48 may be formed from a polymer material or another desired material. The flexible substrate 48 may have a Young's modulus that is less than 10 GPa, less than 5 GPa, less than 3 GPa, less than 2 GPa, less than 1 GPa, etc. The highly stretchable polymer material 48 may be formed as a blanket layer across the entire display. In rigid pixel islands 42, additional pixel components are included on top of the highly stretchable polymer material such that the flexibility is mitigated in the rigid pixel islands. However, between the rigid pixel islands the highly stretchable polymer material maintains its flexibility.

The flexible interconnect region 46 between the rigid pixel islands may have a tensile strain threshold of greater than 10%, greater than 15%, greater than 20%, etc. By including the flexible interconnect region between rigid pixel islands, the overall display may have a tensile strain threshold of greater than 3% (e.g., 5%, between 3% and 10%, etc.).

Metal signal lines such as signal lines 44 may be included in the flexible interconnect region 46 (sometimes referred to as flexible interconnect portion 46). The signal lines 44 may be used to form data lines (e.g., data lines D in FIG. 2), gate lines (e.g., gate lines G in FIG. 2), power supply lines, etc. The signal lines may have footprints with one or more curved portions to improve the stretchability of the signal lines. The signal lines 44 may sometimes be referred to as having a serpentine shape. The signal lines 44 overlap flexible substrate 48 and may be formed from any desired material (e.g., titanium).

If desired, one or more portions of polymer layer 48 may be removed in flexible interconnect portion 46 to improve the stretchability of the display. As shown, there may be one or more optional cutouts such as cutout 50. The cutouts may be formed between the rigid pixel islands. The cutouts do not overlap the signal lines 44 (which are formed on the polymer layer 48). Including cutouts may improve the stretchability of display 14.

Figure 4:
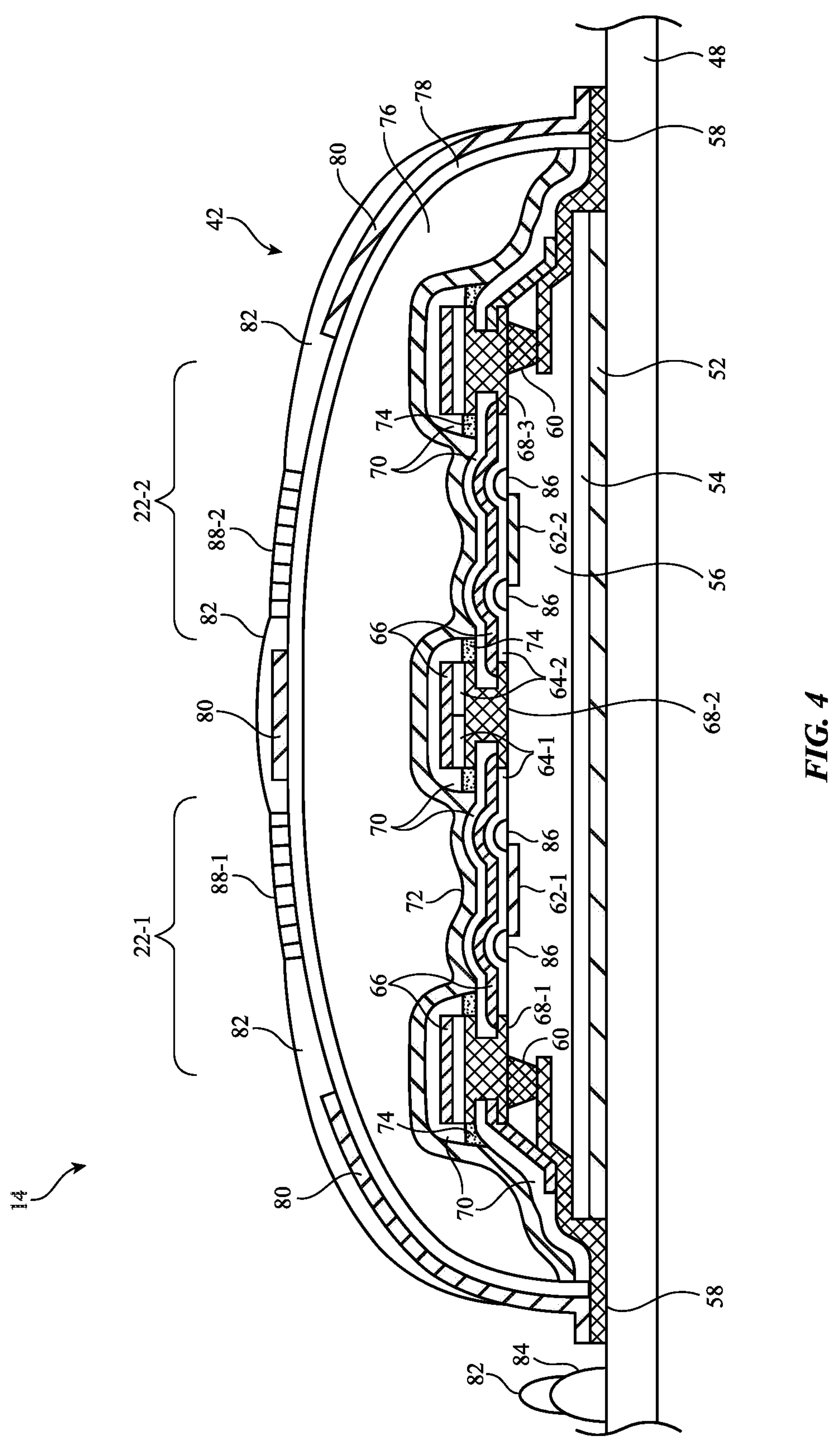
FIG. 4 is a cross-sectional side view of an illustrative display with rigid pixel islands on a flexible substrate in accordance with some embodiments.

FIG. 4 is a cross-sectional side view of an illustrative display with a rigid pixel island. As shown in FIG. 4, polymer substrate 48 extends under the rigid pixel island. A metal shielding layer 52 (sometimes referred to as bottom shield metal (BSM) 52, metal layer 52, etc.) is formed on substrate 48. The metal layer 52 may help improve the robustness of the rigid pixel island to avoid damage during patterning and hermetic sealing (e.g., during manufacturing). The metal layer 52 may also protect the rigid pixel island from damage during operation of electronic device 10. The metal layer may be relatively rigid (e.g., more rigid than substrate 48). In other words, the metal layer 52 may have a higher Young's modulus than substrate 48.

One or more insulating layers such as insulating layers 54 and 56 may be formed over the metal layer. The insulating layers 54 and 56 may be formed from dielectric materials such as polyimide, organic resin, or any other desired material. One or more conductive components (e.g., signal lines and/or vias) that are used to control the operation of pixels in the rigid pixel island may be embedded in or formed on the insulating layers.

FIG. 4 shows how a conductive layer 58 (sometimes referred to as metal layer 58) may have a portion that is embedded within the one or more insulating layers 56. The conductive layer 58 may serve as a signal line for the display. As one example, the conductive layer 58 may provide a cathode voltage to the pixels of the rigid pixel island 42.

The pixels in rigid pixel island 42 may be organic light-emitting diode (OLED) pixels. In FIG. 4, two OLED pixels are shown. The first pixel 22-1 has a corresponding electrode 62-1 and the second pixel 22-2 has a corresponding electrode 62-2. Each electrode 62 may receive a per-pixel voltage to control emission of light by that pixel. The pixels may share a common electrode 66 that is provided a common voltage for all of the pixels in the rigid pixel island. In the example described herein, electrodes 62-1 and 62-2 are anodes and electrode 66 is a common cathode. However, it should be understood that the inverse arrangement (where electrodes 62-1 and 62-2 are cathodes and electrode 66 is a common anode) may instead be used if desired.

Organic light-emitting diode layers such as organic light-emitting diode layers 64 may be interposed between electrodes 62 and common electrode 66. The organic light-emitting diode layers may include a hole injection layer, a hole transport layer, an emissive layer, an electron transport layer, and an electronic injection layer (as one possible arrangement). The OLED layers may include first OLED layers 64-1 for the first pixel 22-1 and second OLED layers 64-2 for the second pixel 22-2. The first pixel 22-1 may emit light of a first color and the OLED layers 64-1 therefore include an emissive layer of the first color. The second pixel 22-2 may emit light of a second color and the OLED layers 64-2 therefore include an emissive layer of the second color. A pixel definition layer 86 may be included that defines apertures through which the pixels emit light. Pixel definition layer 86 may be non-opaque (e.g., a transmission that is greater than 40%, greater than 60%, greater than 80%, greater than 90%, etc.).

The rigid pixel island of FIG. 4 also includes one or more conductive cutting structures. FIG. 4 shows a first conductive cutting structure 68-1 (sometimes referred to as first conductive cutting structure portion 68-1), a second conductive cutting structure 68-2 (sometimes referred to as second conductive cutting structure portion 68-2), and a third conductive cutting structure 68-3 (sometimes referred to as third conductive cutting structure portion 68-3). The conductive cutting structures may provide a cathode voltage to cathode 66 for the pixels in rigid pixel island 42. One or more conductive vias 60 may be included that electrically connect conductive layer 58 to the conductive cutting structures 68. The conductive cutting structures 68 (sometimes referred to as conductive cutting structure portions 68) therefore receive the cathode voltage from conductive layer 58 and via 60. The conductive cutting structures may be in direct contact with cathode 66.

In addition to providing the cathode voltage to cathode 66, the cutting structures 68 may cause discontinuities in one or more of the layers in OLED layers 64. Without discontinuities in OLED layers 64, lateral leakage may cause crosstalk between the pixels. For example, when pixel 22-1 is on and pixel 22-2 is nominally off, leakage current may pass through the conductive OLED layers to pixel 22-2 and cause undesired emission of light from the nominally off pixel 22-2.

As will be shown and discussed in more detail in connection with FIGS. 6 and 7, the cutting structures 68 may have an undercut that causes a discontinuity in OLED layers 64 during the deposition of the OLED layers 64. The cutting structures may also cause discontinuities in the cathode 66 during deposition of the cathode 66. However, because the cutting structures 68 are conductive and in direct contact with cathode 66, the cathode voltage is still distributed across the cathode for all of the pixels as desired.

One or more encapsulation layers may be formed over the pixels in the rigid pixel island. The one or more encapsulation layers may contribute to the rigidity of the rigid pixel islands. Therefore, these encapsulation layers are omitted in the flexible interconnect region 46 between the rigid pixel islands. However, each rigid pixel island still includes respective encapsulation layers so that each rigid pixel island is hermetically sealed.

As shown in FIG. 4, a first passivation layer 70 is formed over cathode 66. Passivation layer 70 may be formed from, for example, an inorganic material. Passivation layer 70 may be deposited using, for example, chemical vapor deposition (CVD) or atomic layer deposition (ALD). During deposition of the passivation layer 70, there may be gaps between portions of the passivation layer 70 over the anodes and portions of the passivation layer 70 over the cutting structures. If care is not taken, these gaps may cause imperfections in the hermetic seal for the rigid pixel island.

To ensure a hermetic seal in rigid pixel island 42, a planarization layer 74 (sometimes referred to as inkjet printed layer 74, organic layer 74, etc.) may be formed in the gaps between passivation layer 70. Planarization layer 74 may be formed from an organic material (e.g., that is deposited using inkjet printing). During formation of planarization layer 74, the planarization layer 74 may be deposited (e.g., via inkjet printing) across the rigid pixel island. Subsequently, the majority of planarization layer 74 is removed. However, multiple discrete portions of planarization layer 74 are left in the small gaps in the passivation layer 70 (e.g., between portions of the passivation layer 70 over the anodes and portions of the passivation layer 70 over the cutting structures). This effectively planarizes the passivation layer 70 and allows for an additional passivation layer 72 to be formed over passivation layer 70.

Including multiple discrete portions of layer 74 (e.g., only where necessary instead of a blanket layer across the entire display or rigid pixel island) allows for an effective hermetic seal while mitigating the thickness of the rigid pixel island and the manufacturing cost and complexity.

Passivation layer 72 may be formed from, for example, an inorganic material. Passivation layer 72 may be deposited using, for example, chemical vapor deposition (CVD) or atomic layer deposition (ALD). Together, passivation layers 70 and 72 and inkjet printing layer 74 may form a hermetic seal that prevents moisture from reaching OLED layers 64 in rigid pixel island 42. As shown in FIG. 4, no portions of layer 74 are included between the first and second inorganic passivation layers 70 and 72 in some portions of the first and second inorganic passivation layers.

Passivation layer 70 may have a thickness that is less than 2 microns, less than 1 micron, less than 500 nanometers, less than 300 nanometers, less than 200 nanometers, etc. Passivation layer 72 may have a thickness that is less than 2 microns, less than 1 micron, less than 500 nanometers, less than 300 nanometers, less than 200 nanometers, etc.

An additional planarization layer 76 (sometimes referred to as encapsulation layer 76) may be formed over passivation layer 72. Planarization layer 76 may be formed from an organic material (e.g., that is deposited using inkjet printing).

An additional layer 78 may be formed over planarization layer 76. Layer 78 may be an inorganic dielectric layer that is formed underneath touch sensor metal 80. Layer 78 may sometimes be referred to as an inorganic touch layer.

Upon initial deposition, the combination of passivation layers 70 and 72 and planarization layer 74 may maintain continuity (e.g., a hermetic seal) over the cutting structures 68. However, the cutting structures may create seams in the overlying layers that, over time, may be penetrated by moisture and expand to eventually create openings that undesirably expose the underlying OLED layers to moisture.

To mitigate moisture penetration through seams in passivation layers 70 and 72, a metal layer 80 may be formed over the cutting structures. Metal layer 80 blocks moisture from penetrating seams in passivation layers 70 and 72, improving the robustness of the rigid pixel island. Additionally, metal layer 80 may also optionally serve as touch sensor metal for a touch sensitive layer. This example is merely illustrative. If desired, metal layer 80 may be formed from a different material (and during a different manufacturing step) than the touch sensor metal.

As shown in FIG. 4, a black pixel definition layer 82 may be formed over touch sensor metal 80 and inorganic layer 78. Black pixel definition layer 82 may be opaque (e.g., with a transmission that is less than 40%, less than 30%, less than 15%, less than 5%, etc.). The black pixel definition layer 82 may define apertures through which pixels 22-1 and 22-2 emit light. As shown in FIG. 4, color filter elements may be formed in the apertures in pixel definition layer 82. A first color filter element 88-1 is formed over anode 62-1 for pixel 22-1. For example, when pixel 22-1 is a blue pixel the color filter element 88-1 may be a blue color filter element that passes blue light and blocks other colors of light. A second color filter element 88-2 is formed over anode 62-2 for pixel 22-2. For example, when pixel 22-2 is a green pixel the color filter element 88-2 may be a green color filter element that passes green light and blocks other colors of light.

A spacer 84 may be formed at the edge of the rigid pixel island. A portion of pixel definition layer 82 may be formed over spacer 84. The spacer is formed outside the periphery of the rigid pixel island (e.g., non-overlapping with the encapsulation layers and/or OLED layers of the rigid pixel island). The spacer may be formed in direct contact with substrate 48 for example (or attached to substrate 48 with an adhesive layer).

Figure 5:
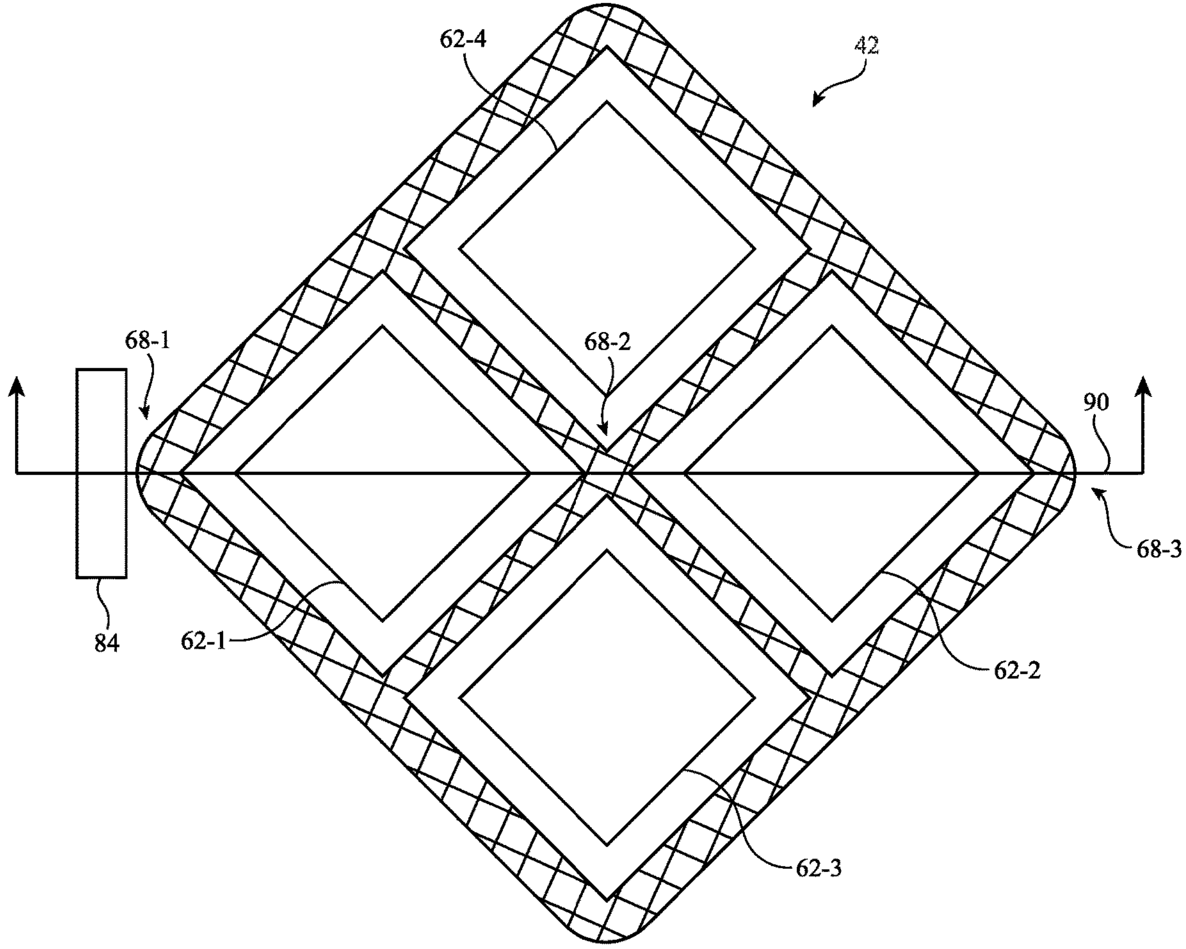
FIG. 5 is a top view of an illustrative rigid pixel island in accordance with some embodiments.

FIG. 5 is a top view of the rigid pixel island of FIG. 4. In particular, the cross-sectional side view of FIG. 4 may be taken along line 90 in FIG. 5. As shown in FIG. 5, the cutting structure portions may be formed as part of a continuous cutting structure that defines a grid in which the anodes for the pixels are formed. In other words, the grid of the cutting structure completely laterally surrounds a first anode 62-1 in a respective opening in the grid, completely laterally surrounds a second anode 62-2 in a respective opening in the grid, etc. In the example of FIG. 5, rigid pixel island 42 includes 4 pixels with respective anodes 62-1, 62-2, 62-3, and 62-4. In one illustrative example, the rigid pixel island may include two green pixels, one red pixel, and one blue pixel. This example is merely illustrative. In general, each rigid pixel island may include any desired number of pixels of any desired respective colors.

Figure 6:
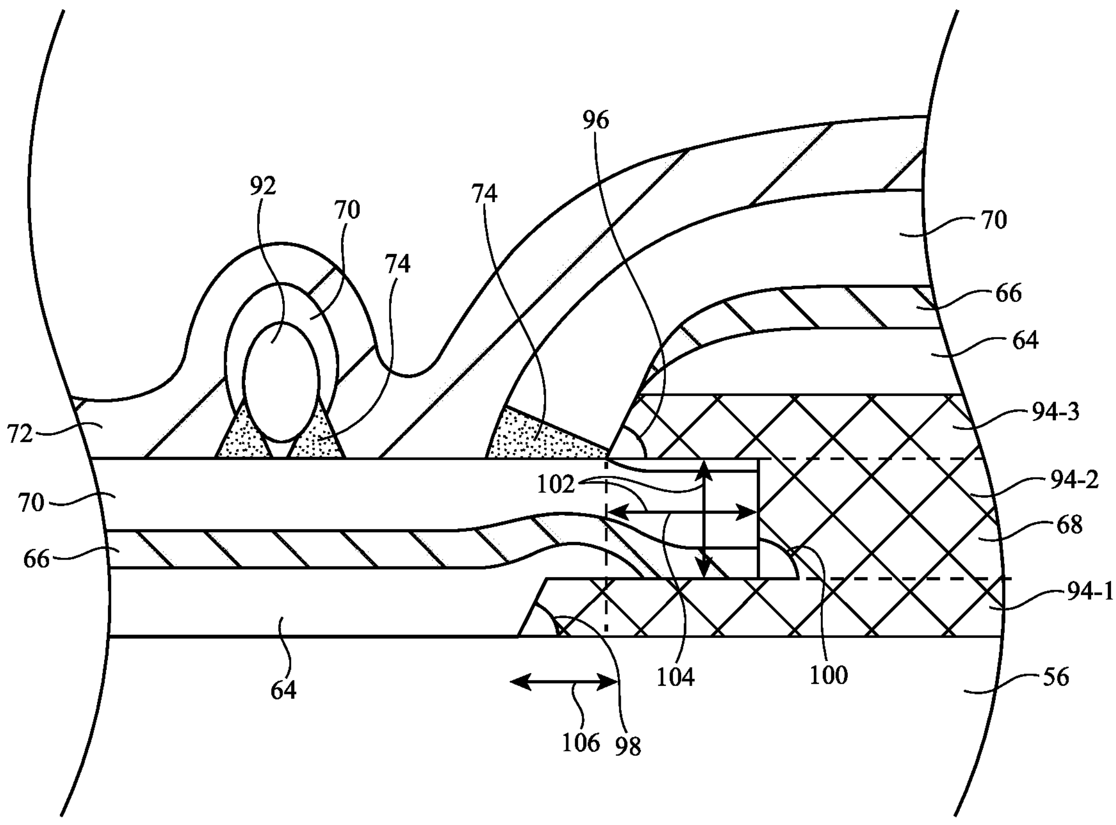
FIG. 6 is a cross-sectional side view of an illustrative rigid pixel island with a conductive cutting structure in accordance with some embodiments.

FIG. 6 is a cross-sectional side view showing the cutting structure 68. As shown, cutting structure 68 has an undercut (sometimes referred to as a recess, cavity, hole, indentation, etc.). The undercut is a void in the cutting structure material that is still covered by a portion of the cutting structure. As shown in FIG. 6, the undercut may have a width 104 and a height 102. In this arrangement, width 104 is defined as the distance between the edge of portion 94-3 of the cutting structure and the edge of portion 94-2 of the cutting structure. Height 102 is defined as the distance between a lower surface of portion 94-3 of the cutting structure and an upper surface of portion 94-1 of the cutting structure. Width 104 and height 102 may each be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). Height 102 and width 104 may be the same or may be different. In one example, height 102 may be less than 50 nanometers and width 104 may be greater than 20 nanometers.

In the example of FIG. 6, cutting structure 68 may be formed from portions 94-1, 94-2, and 94-3 (sometimes referred to as layers 94-1, 94-2, and 94-3). Portions 94-1, 94-2, and 94-3 may optionally be formed during individual deposition steps. Each portion may be formed from any desired conductive material.

Each one of portions 94-1, 94-2, and 94-3 may have a thickness that is equal to any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, more than 10 nanometers, more than 20 nanometers, between 10 and 100 nanometers, etc.). The thicknesses may be the same or may be different.

The angles of the edges of portions 94-1, 94-2, and 94-3 may be selected to control the discontinuities of the overlying organic light-emitting diode layers. As shown in FIG. 6, portion 94-1 has an edge surface that is at an angle 98 relative to the planar upper surface of insulating layer 56 (and relative to the planar lower surface of portion 94-1). Portion 94-2 has an edge surface that is at an angle 100 relative to the planar upper surface of insulating layer 56 (and relative to the planar lower surface of portion 94-2). Portion 94-3 has an edge surface that is at an angle 96 relative to the planar upper surface of insulating layer 56 (and relative to the planar lower surface of portion 94-3). Angles 96, 98, and 100 may be the same or may be different. Each of the angles may be any desired angle (e.g., between 45° and 90°, between 25° and 135°, between 45° and 55°, between 55° and 65°, between 75° and 85°, between 85° and 95° between 45° and 65°, between 70° and 90°, between 10° and 45°, less than 90°, etc.).

In FIG. 6, a portion of layer 94-1 is not covered by layer 94-3. Said another way, layer 94-1 extends past the edge of layer 94-3 (e.g., towards the center of the anode). The width 106 of the portion of layer 94-1 that is not covered by layer 94-3 may be any desired distance (e.g., less than 1 micron, less than 500 nanometers, less than 250 nanometers, less than 150 nanometers, less than 100 nanometers, less than 75 nanometers, less than 50 nanometers, less than 35 nanometers, less than 25 nanometers, less than 20 nanometers, less than 10 nanometers, more than 10 nanometers, more than 20 nanometers, between 10 and 100 nanometers, greater than 40 nanometers, etc.). The portion of layer 94-1 that is not covered by layer 94-3 may be referred to as a step portion of the cutting structure.

Each side of the cutting structure may have an arrangement of the type shown in FIG. 6 to cause discontinuities in the OLED layers 64.

FIG. 6 further shows how, in addition to being formed in gaps between portions of the passivation layer 70 over the anodes and portions of the passivation layer 70 over the cutting structures, inkjet printed layer 74 may be formed under particles such as particle 92. Particles may land on the display during manufacturing. The planarization layer 74 may be selectively formed around particles on the display to ensure a hermetic seal is formed by passivation layers 70 and 72.

Figure 7:
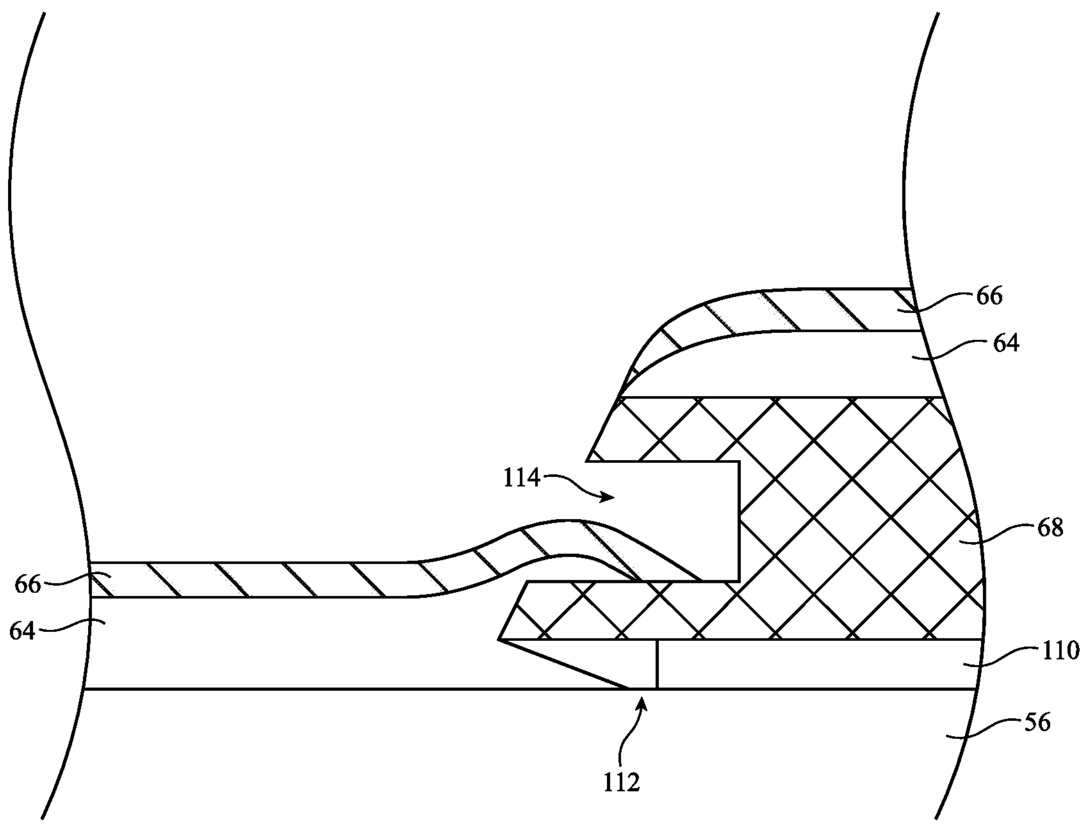
FIG. 7 is a cross-sectional side view of an illustrative rigid pixel island with a conductive cutting structure that has two associated undercuts in accordance with some embodiments.

If desired, as shown in FIG. 7, an additional layer such as inorganic layer 110 may be formed between conductive cutting structure 68 and insulating layer 56. As previously discussed in connection with FIG. 6, the cutting structure 68 creates an undercut 114. The inorganic layer 110 may have dimensions selected to create an additional undercut 112. In particular, the bottom portion of cutting structure 68 (e.g., portion 94-1 in FIG. 6) may extend past the edge of layer 110 towards a center of the pixel, creating an undercut 112 underneath the cutting structure. The undercut 112 may cause a discontinuity in at least one layer of the OLED layers 64 (e.g., a hole injection layer) while preserving continuity in cathode 66. The cathode has a separate discontinuity caused by cutting structure 68.

The example of using cutting structure 68 and inorganic layer 110 to create undercut 112 is merely illustrative. In another possible arrangement, pixel definition layer 86 (which may be formed from an organic material) may be shaped to have an undercut that causes discontinuity in at least one layer of the OLED layers 64. The conductive cutting structure has a separate undercut that causes a discontinuity in the cathode, as previously discussed.

Of the OLED layers 64, the hole injection layer may be highly susceptible to lateral leakage. Therefore, the undercut 112 of FIG. 7 may have dimensions selected to cause a discontinuity in at least the hole injection layer of the OLED layers 64.

Herein, an example has been described where the display with rigid pixel islands is used to form a stretchable display. In particular, the entire display may have rigid pixel islands and a corresponding flexible interconnect region such that the entire display is stretchable. This example is merely illustrative. In one alternative embodiment, the arrangement described herein with relation to a rigid pixel island may instead be used for a rigid display. In other words, a rigid display may be formed from a single rigid pixel island with an array of pixels. Even if the display is not stretchable (as in this case where the entire display is rigid), the principles described in connection with the rigid pixel islands may be used to form a display with a small inactive border area. Therefore, a display may use the arrangements described herein even when the entire display is rigid.

Figure 8:
FIG. 8 is a top view of an illustrative display with a rigid central portion and a stretchable edge portion in accordance with some embodiments.
Figure 8:
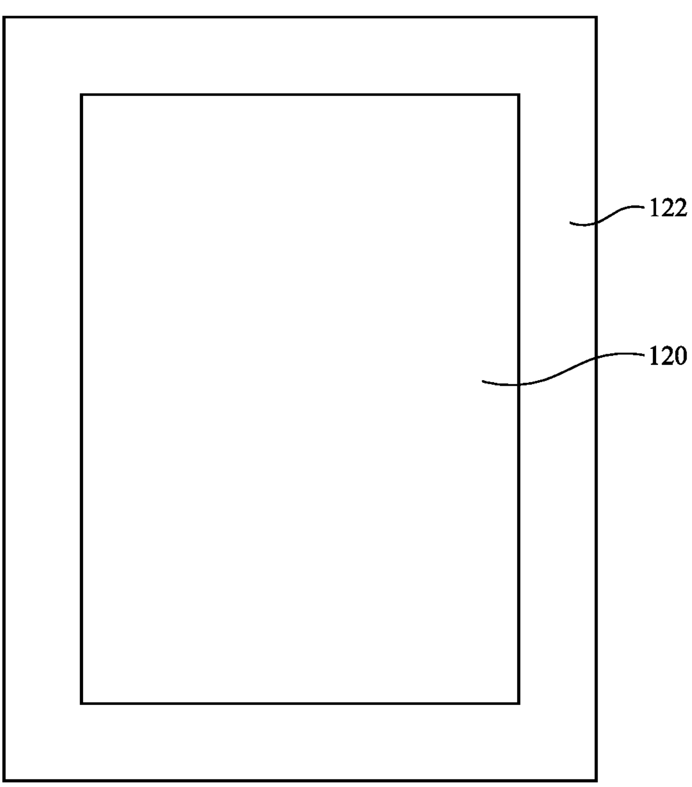

In another alternative embodiment, shown in FIG. 8, display 14 has a central portion 120 with a first pixel density (e.g., pixels per inch or PPI) and an edge portion 122 with a second pixel density. The second pixel density may be lower than the first pixel density. The central portion 120 may be formed from a single rigid pixel island that includes an array of pixels. The edge portion 122 may be formed from multiple rigid pixel islands 42 that are connected by a flexible interconnect portion 46 (e.g., as shown in FIG. 3). The central portion 120 is therefore rigid whereas the edge portion 122 is stretchable. This type of arrangement may be used to form a display with a planar central portion 120 and curvature (optionally including compound curvature) in the edge portion 122. The pixel density in edge portion 122 may be at least 5% less than the pixel density in central portion 120, at least 10% less than the pixel density in central portion 120, at least 20% less than the pixel density in central portion 120, at least 50% less than the pixel density in central portion 120, etc.

Figure 9:
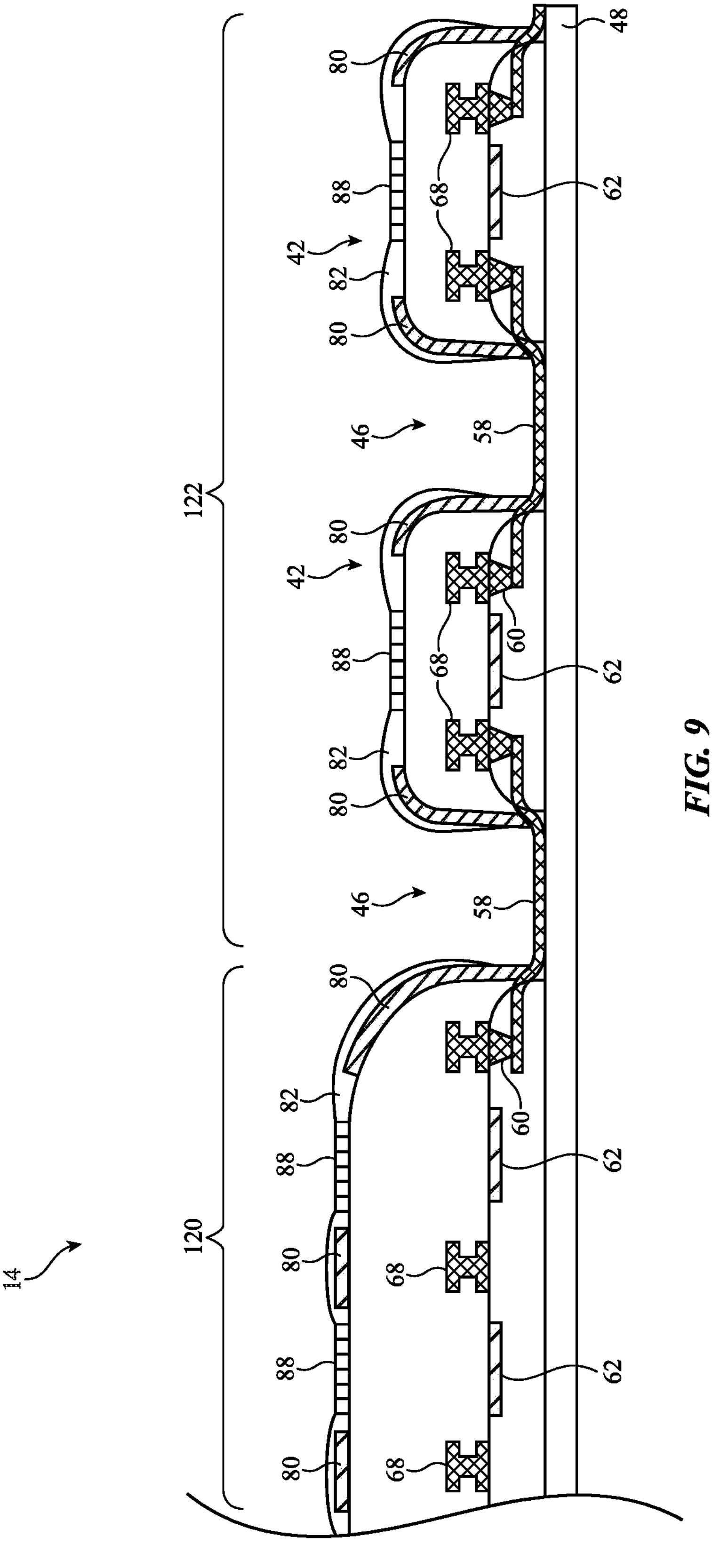
FIG. 9 is a cross-sectional side view of an illustrative display with a rigid central portion and a stretchable edge portion in accordance with some embodiments.

FIG. 9 is a cross-sectional side view of an illustrative display of the type shown in FIG. 8. As shown, multiple pixels are formed in the rigid central portion 120. In edge portion 122, discrete rigid pixel islands 42 are connected by flexible interconnect portion 46. It is noted that the details of the OLED layers and encapsulation layers have been omitted from FIG. 9 to avoid obfuscating the drawing.

It is noted that a display may alternatively have the arrangement of only central portion 120 (e.g., an entirely rigid display) or the arrangement of only portion 122 (e.g., an entirely stretchable display) if desired.

Figure 10:
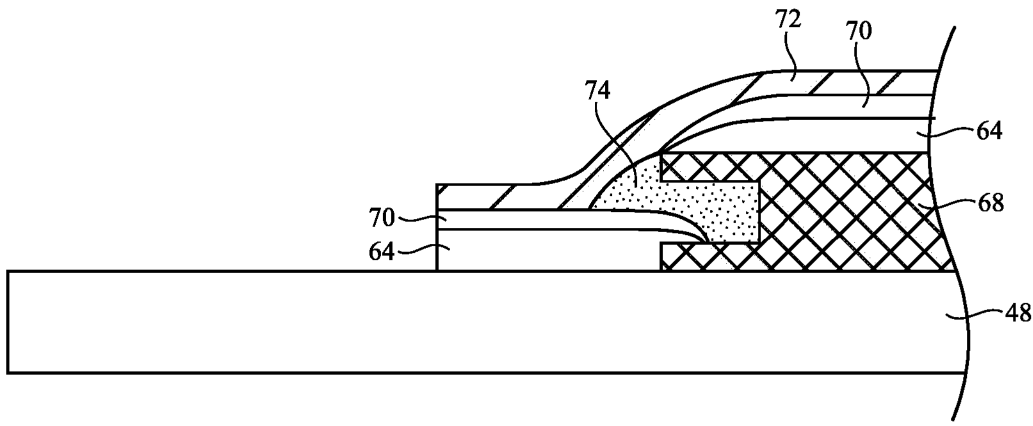
FIG. 10 is a cross-sectional side view of an edge of a rigid pixel island with OLED layers and passivation layers that are etched at the same time in accordance with some embodiments.

FIG. 10 is a cross-sectional side view of an edge of a rigid pixel island. As shown, at the edge of the rigid pixel island the OLED layers 64 and passivation layers 70 and 72 may be removed. In the example of FIG. 10, the OLED layers 64 and passivation layers 70/72 are etched at the same time. Consequently, a portion of the side surface of OLED layers 64 is exposed. If care is not taken, moisture may penetrate this exposed portion of OLED layers 64 (e.g., during subsequent processing steps such as on-cell touch formation).

Figure 11:
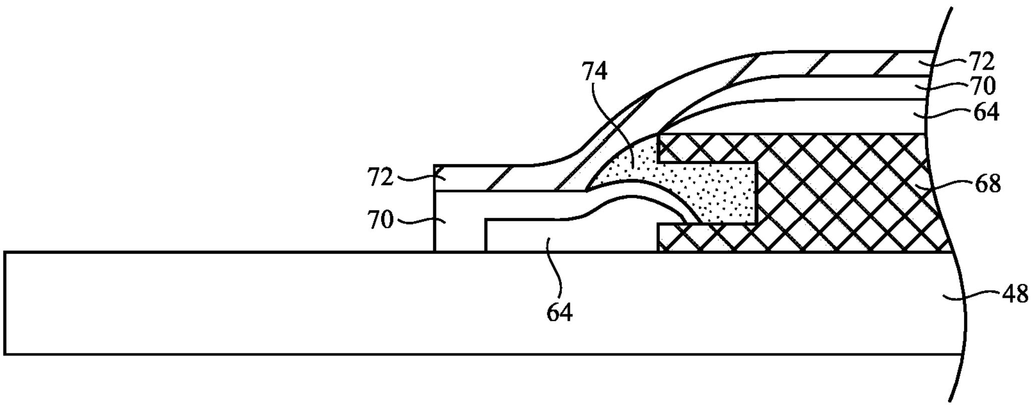
FIG. 11 is a cross-sectional side view of an edge of a rigid pixel island with OLED layers and passivation layers that are etched at different times in accordance with some embodiments.

In an alternative embodiment, shown in FIG. 11, the OLED layers are etched before deposition of the passivation layers 70 and 72. This results in the OLED layers 64 being fully encapsulated by passivation layers 70 and 72 (including the side surface of OLED layers 64 at the etched edge). This type of arrangement may form a complete seal of the OLED layers 64 for subsequent manufacturing (e.g., on-cell touch formation).

In the aforementioned embodiment of FIG. 4, multiple discrete portions of planarization layer 74 are included (e.g., only where necessary instead of a blanket layer across the entire display or rigid pixel island). This example is merely illustrative. In another possible arrangement, shown in FIG. 12, a planarization layer 206 is formed between passivation layers 70 and 72. The planarization layer 206 may be an inkjet printed (IJP) layer that is formed continuously across a rigid pixel island (as opposed to in multiple discrete portions as in FIG. 4). The thickness of planarization layer 206 may be less than 10 microns, less than 15 microns, between 2 and 10 microns, etc. Planarization layer 206 may serve to encapsulate and planarize any particles that are generated during the deposition of OLED layers 64 and other encapsulation layers.

Figure 12:
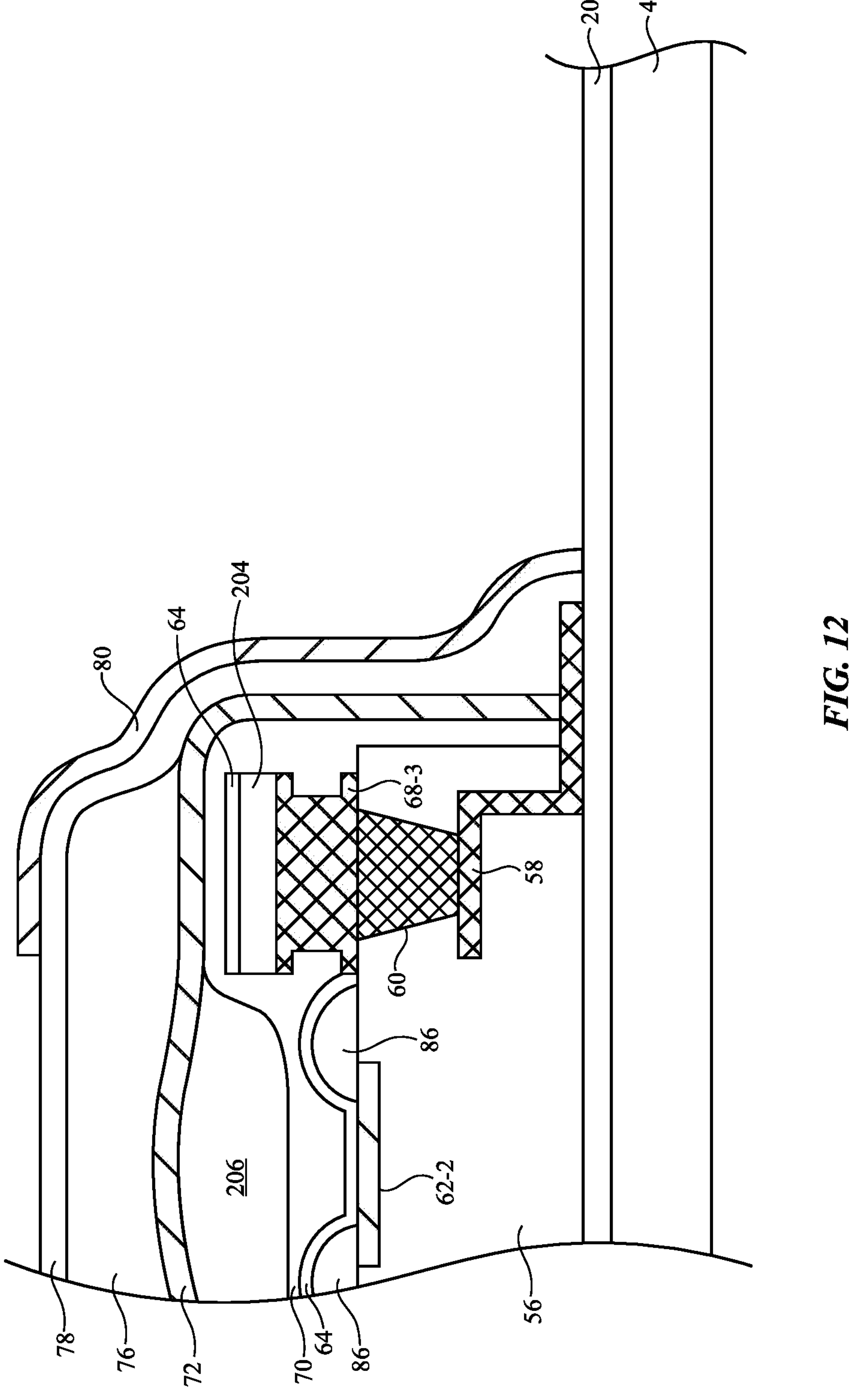
FIG. 12 is a cross-sectional side view of an illustrative display with an inkjet printed planarization layer between first and second passivation layers in accordance with some embodiments.

An inorganic layer 202 may be formed between substrate 48 and insulating layer(s) 56. In addition, FIG. 12 shows a spacer 204 that is formed over cutting structure 68-3. The combination of the cutting structure 68-3 and spacer 204 form a dam that prevents overflow of planarization layer 206. Multiple dams of this type may optionally be included at the edge of the active area of the display. Each cutting structure may optionally be formed from three layers of metal (e.g., a layer of aluminum interposed between two layers of titanium).

Figures 13, 14:
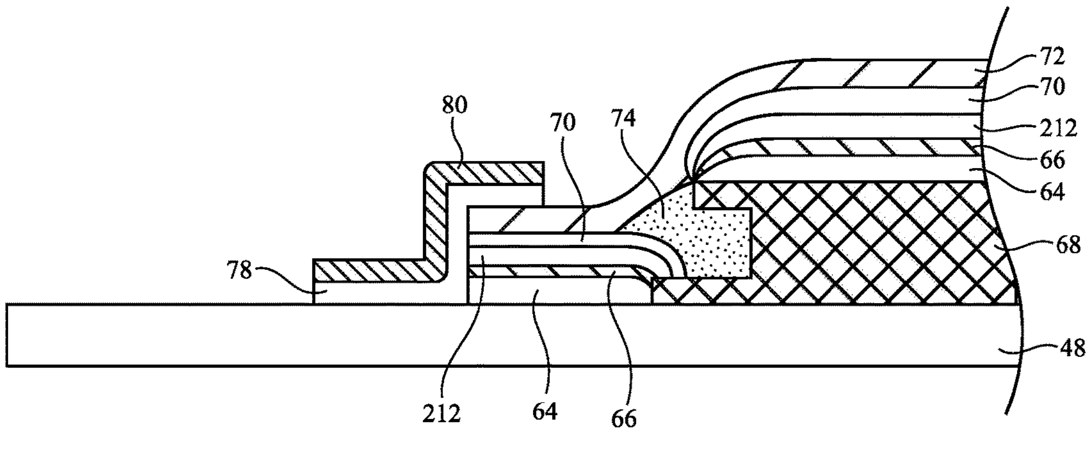
FIG. 13 is a cross-sectional side view of an edge of a rigid pixel island with OLED layers and passivation layers that are etched at the same time and then covered by a touch inorganic layer and a touch sensor metal layer in accordance with some embodiments.
FIG. 14 is a cross-sectional side view of an edge of a rigid pixel island with a cathode dewetting layer in accordance with some embodiments.

FIG. 10 shows an example where the OLED layers 64 and passivation layers 70/72 are etched at the same time. Consequently, a portion of the side surface of OLED layers 64 is exposed. To prevent moisture from penetrating this exposed portion of OLED layers 64 (e.g., during subsequent processing steps such as on-cell touch formation), one or more additional layers such as touch sensor metal 80 and inorganic touch layer 78 (e.g., as in FIG. 12) may be formed over the exposed portions of OLED layers 64. FIG. 13 shows an example of this type. As shown in FIG. 13, touch inorganic layer 78 and touch sensor metal 80 conform to the side surfaces of OLED layers 64, cathode 66, organic layer 212, and first and second passivations layers 70 and 72.

It is noted that, for simplicity, cathode 66 is not depicted in FIGS. 10 and 11. However, as shown in FIG. 13, cathode 66 may be formed over OLED layers 64. Additionally, an organic layer 212 may be formed over cathode 66 such that cathode 66 is interposed between OLED layers 64 and cathode 66.

During manufacturing, a photoresist may be formed over the portions of OLED layers 64, cathode 66, organic layer 212, and first and second passivations layers 70 and 72 that are not removed during etching. The OLED layers 64, cathode 66, organic layer 212, and first and second passivations layers 70 and 72 are then removed via a dry etching process. After the etching process is complete, the photoresist may be removed (e.g., using $O_2$ plasma). After the photoresist is removed, touch inorganic layer 78 may be patterned to cover and directly contact the exposed side surfaces of OLED layers 64, cathode 66, organic layer 212, and first and second passivations layers 70 and 72. Touch sensor metal 80 is then formed over touch inorganic layer 78. The touch inorganic layer 78 and touch sensor metal 80 may prevent moisture from penetrating exposed portion of layers such as OLED layers 64 and causing reliability issues.

Etching cathode 66 may be more difficult than desired in some circumstances. To mitigate the cost and complexity of etching the edge layers an organic dewetting layer 214 may be included at an edge. FIG. 14 shows an example of a display with a dewetting layer. The dewetting layer 214, sometimes referred to as cathode dewetting layer 214 may be deposited immediately after cathode 66 during manufacturing and may prevent cathode 66 from solidifying at the edge. Subsequent removal of the cathode is therefore simplified, reducing the cost and complexity of the manufacturing process. A dewetting layer 214 may be included in any of the aforementioned embodiments that involve etching of cathode 66. The dewetting layer 214 may be formed in non-light-emitting areas of the display where cathode 66 is ultimately removed.

It is noted that the aforementioned embodiments related to an edge of the rigid pixel island may, in general, be applicable to any edge of the substrate in the display. The edge may be formed at the edge of a rigid pixel island within the light-emitting area, at the perimeter of the light-emitting area of the display (even if rigid pixel islands are not included in the display), etc.

The foregoing is merely illustrative and various modifications can be made by those skilled in the art without departing from the scope and spirit of the described embodiments. The foregoing embodiments may be implemented individually or in any combination.

What is claimed is:

1. A display comprising:

a first organic light-emitting diode pixel comprising a first electrode;

a second organic light-emitting diode pixel comprising a second electrode;

a common electrode for the first and second organic light-emitting diode pixels;

a conductive layer that has a first portion that forms part of the first organic light-emitting diode pixel and a second portion that forms part of the second organic light-emitting diode pixel; and a conductive structure that is interposed between the first and second electrodes, wherein the conductive structure has an undercut that causes a discontinuity in the conductive layer and wherein the conductive structure is electrically connected to the common electrode.

2. The display defined in claim 1, wherein the first electrode is a first anode, wherein the second electrode is a second anode, and wherein the common electrode is a cathode.

3. The display defined in claim 2, wherein the conductive layer is a hole injection layer.

4. The display defined in claim 1, further comprising:

a first inorganic passivation layer that is formed over the common electrode.

5. The display defined in claim 4, further comprising:

a second inorganic passivation layer that is formed over the first inorganic passivation layer.

6. The display defined in claim 5, further comprising:

an organic layer with multiple discrete portions between the first and second inorganic passivation layers.

7. The display defined in claim 6, wherein the organic layer is an inkjet printed layer.

8. The display defined in claim 6, further comprising:

an encapsulation layer that is formed over the second inorganic passivation layer.

9. The display defined in claim 8, further comprising:

an inorganic layer that is formed over the encapsulation layer.

10. The display defined in claim 9, further comprising:

a touch sensor metal layer that is formed on the inorganic layer and that overlaps the undercut of the conductive structure.

11. The display defined in claim 10, further comprising:

a black pixel definition layer that is formed over the inorganic layer and the touch sensor metal layer, wherein the black pixel definition layer has apertures; and color filter elements formed in the apertures.

12. The display defined in claim 1, further comprising:

an insulating layer, wherein the first and second electrodes are formed on the insulating layer; and a layer of shielding metal, wherein the insulating layer is interposed between the first electrode and the layer of shielding metal.

13. The display defined in claim 1, further comprising:

a plurality of rigid pixel islands, wherein a first rigid pixel island of the plurality of rigid pixel islands includes the first and second organic light-emitting diode pixels; and a flexible interconnect region that is interposed between the plurality of rigid pixel islands.

14. The display defined in claim 13, wherein the flexible interconnect region comprises a flexible polymer layer and serpentine conductive signal lines.

15. A display comprising:

a plurality of pixels, wherein each pixel has a respective anode;

a common cathode for the plurality of pixels;

organic light-emitting diode layers for the plurality of pixels that are interposed between the anodes and the common cathode;

a first inorganic passivation layer that is formed over the common cathode;

a second inorganic passivation layer that is formed over the first inorganic passivation layer; and an organic layer with multiple discrete portions between the first and second inorganic passivation layers, wherein no portions of the organic layer are included between the first and second inorganic passivation layers in some portions of the first and second inorganic passivation layers.

16. The display defined in claim 15, wherein the plurality of pixels is hermetically sealed by at least the first and second inorganic passivation layers.

17. The display defined in claim 15, wherein at least one of the multiple discrete portions of the organic layer is formed underneath a particle.

18. The display defined in claim 15, further comprising:

a touch inorganic layer that covers side surfaces of the organic light-emitting diode layers, the common cathode, the first inorganic passivation layer, and the second inorganic passivation layer.

19. The display defined in claim 15, further comprising:

a substrate, wherein the plurality of pixels are formed on the substrate; and a cathode dewetting layer at an edge of the substrate.

20. A display comprising:

a plurality of hermetically sealed rigid pixel islands; and a flexible interconnect region that is interposed between the plurality of hermetically sealed rigid pixel islands, wherein each hermetically sealed rigid pixel island comprises:

at least one organic light-emitting diode pixel with organic light-emitting diode layers interposed between first and second electrodes; and a conductive cutting structure that causes a discontinuity in one of the organic light-emitting diode layers and that is electrically connected to the second electrode.

21. The display defined in claim 20, wherein each hermetically sealed rigid pixel island further comprises:

a first inorganic passivation layer that is formed over the second electrode;

a second inorganic passivation layer that is formed over the first inorganic passivation layer; and an organic inkjet printed layer with multiple discrete portions between the first and second inorganic passivation layers.

22. The display defined in claim 20, wherein the plurality of hermetically sealed rigid pixel islands is formed on a flexible polymer layer and wherein the flexible interconnect region comprises signal lines on the flexible polymer layer.

* * * * *